US007221611B2

(12) United States Patent
Han et al.

(10) Patent No.: US 7,221,611 B2
(45) Date of Patent: May 22, 2007

(54) SEMICONDUCTOR MEMORY DEVICE FOR LOW POWER CONSUMPTION

(75) Inventors: Gong-Heum Han, Gyeonggi-do (KR); Choong-Keun Kwak, Suwon-si (KR); Joon-Min Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 32 days.

(21) Appl. No.: 11/146,513

(22) Filed: Jun. 7, 2005

(65) Prior Publication Data
US 2005/0281106 A1 Dec. 22, 2005

(30) Foreign Application Priority Data
Jun. 16, 2004 (KR) ............... 10-2004-0044588

(51) Int. Cl.
*G11C 5/14* (2006.01)
*G11C 7/00* (2006.01)

(52) U.S. Cl. ............... 365/226; 365/189.11; 365/203

(58) Field of Classification Search ........... 365/226, 365/203, 189.11
See application file for complete search history.

(56) References Cited

U.S. PATENT DOCUMENTS 6,519,191 B1 * 2/2003 Morishita ............... 365/189.09
6,791,895 B2 * 9/2004 Higeta et al. ............... 365/226
6,816,418 B2 * 11/2004 Hidaka ................ 365/189.09
2001/0001598 A1 5/2001 Narui et al.
2003/0147272 A1 8/2003 Joshi et al.

* cited by examiner

*Primary Examiner*—Son Dinh
(74) *Attorney, Agent, or Firm*—F. Chau & Assoc., LLC

(57) ABSTRACT

A semiconductor memory device, which has an array of memory cells connected with a plurality of bit line pairs and a plurality of word lines, to perform a read or write operation of data, having low power consumption is provided. The device includes a first power supply for supplying a first power source voltage. Also, a second power supply supplies a second power source voltage having a lower voltage level than the first power source voltage. Further, the device includes a standard ground. An elevated ground circuit provides an elevated ground voltage having a higher voltage level than that of the standard ground. A first power circuit is connected with the first power supply and the standard ground, and operates in response to the first power source voltage. A second power circuit is connected with the second power supply and the elevated ground circuit, and operates in response to the second power source voltage. Thereby, power and chip size can be reduced.

16 Claims, 5 Drawing Sheets

SEMICONDUCTOR MEMORY DEVICE FOR LOW POWER CONSUMPTION

The present invention relates to a semiconductor memory device, and more particularly, to a random access memory (RAM) for low power consumption.

BACKGROUND

Techniques to lower the operating voltages of single semiconductor memory devices (or chips) or the operating voltages of the internal memory modules of chips have been proposed to reduce the power consumption of semiconductor memory devices.

However, lowered operating voltages present difficulties with interfacing between semiconductor memory devices and external systems as well as difficulties due to lowered internal voltages. To solve the interface problem with external systems requires a specific regulator or interface circuit to overcome the operating voltage difference between memory devices and external systems. The additional interface circuitry increases chip area and power consumption.

Difficulties due to lowered internal voltages arise in chip manufacturing and design. In other words, lowered threshold voltages resulting from the operation of an internal device at a lower voltage causes leakage currents, and lowers the reliability due to the breakdown voltage decrease and reduces stability due to noise susceptibility.

The research for more economical power consumption of memory devices has progressed by reducing the power consumption of the memory itself, instead of lowering the operating voltage, because of the difficulties described above. The methods to reduce power consumption in memory devices until now have been to improve the amplifier structure of the memory output terminals, using a low-voltage swing bus and multi-divided modules, and to reduce the memory area. Additionally, a method of moving the output terminals of the memory data to both sides to reduce the bit line capacitance and improve the operating speed was also proposed. Various techniques to reduce the power consumed in precharging the bit lines have been proposed.

FIG. 1 is a circuit diagram of a semiconductor memory device according to the prior art, as an example an SRAM (Static Random Access Memory), which includes a memory cell array, a column selection circuit 50, a bit line precharge circuit 60, a write driver circuit 40 and a sense amplifier 30.

The memory cell array is constructed of memory cells 10, in which the memory cells 10 are arranged in rows and columns. The memory cells 10 are connected with three signal lines, a bit line BL, a complementary bit line BLb and a word line SWL.

The desired word line SWL is selected by a row selection circuit (not shown) operating in response to a row address request.

The column selection circuit 50 is constructed of CMOS (Complementary Metal Oxide Semiconductor) circuits 52 and 54 that respond to a column enable signal PYB and an inversion signal of the column enable signal PYB.

The column selection circuit 50 selects a pair of bit lines BL and BLb connected to the memory cells 10 in response to the column enable signal PYB applied through a column decoder 70 operated from an internal power source voltage Vcc, by using a column address request, and connects them with data lines DL and DLb. The selected bit line pair BL and BLb is connected with a sense amplifier 30 and a write driver circuit 40 through the data line pair DL and DLb corresponding to the selected bit line pair BL and BLb.

The bit line precharge circuit 60 precharges the bit line pair BL and BLb connected to the memory cells 10.

In the bit line precharge circuit 60, three PMOS transistors 62, 64 and 66 are connected with the bit line pair BL and BLb. The PMOS transistors 64 and 66 have current paths individually formed between bit lines BL and BLb corresponding to the internal power source voltage Vcc. The PMOS transistor 62 has a current path formed between the bit line pair BL and BLb. The PMOS transistors 62, 64 and 66 are commonly controlled by the bit line precharge signal from the inversion signal of the column enable signal PYB. That is, the PMOS transistors 62, 64 and 66 are switched simultaneously by the bit line precharge voltage level.

The write driver circuit 40 is constructed of NAND gates 41 and 42, PMOS transistors 43 and 46, and NMOS transistors 44, 45, 47 and 48, and drives data DIN on data lines DL and DLb in response to a data write signal PWD in a write operation.

The sense amplifier 30 senses and amplifies data of the memory cells in response to a sense amplifier enable signal PSA in a read operation.

Additionally, the semiconductor memory device according to the prior art includes a data line precharge circuit 80, which is constructed of PMOS transistors 82, 84 and 86 to precharge the data lines. The PMOS transistors 82 and 86 have current paths individually formed between data lines DL and DLb corresponding to the internal power source voltage Vcc. The PMOS transistor 84 has a current path formed between the data line pair DL and DLb.

FIG. 2 is a timing diagram for the operations of FIG. 1, wherein a write operation for data in a semiconductor memory device according to the prior art will be described as follows.

Data DIN is transferred to data lines DL and DLb in response to the data write signal PWD. Then, full voltage swing data is transferred to bit lines BL and BLb through a CMOS transistor of the column selection circuit 50 that responds to the column enable signal PYB. When the word line SWL is enabled, one pair of data is written in a selected memory cell 10 through selected bit lines BL and BLb. The voltage level of the bit lines BL and BLb is swung between the internal power source voltage Vcc and a standard ground voltage Vss.

In such a conventional semiconductor memory device, one pair of bit lines is connected with many cells, e.g., 2K~8K, and data lines are also connected with column selection circuits of the same number as the number of columns. Thus, the loading capacitance in these circuits becomes a factor by consuming large amounts of power in a semiconductor memory device. In particular, in a write operation, the precharge operation having a full voltage swing between the internal power source voltage Vcc and the standard ground voltage Vss of the data line and the bit line becomes a cause of large power consumption in the conventional semiconductor memory device. This is a serious obstacle to efficiently obtaining products having small power consumption.

SUMMARY OF THE INVENTION

A semiconductor memory device for low power consumption is provided, which is capable of realizing a reduction in chip size and a reduction in costs.

According to one embodiment of the invention, a semiconductor memory device, which has an array of memory cells connected with a plurality of bit line pairs and a plurality of word lines, to perform a read or write operation of data, includes a first power supply for supplying a first power source voltage; a second power supply for supplying a second power source voltage having a lower voltage level than the first power source voltage; a standard ground; an elevated ground circuit for providing an elevated ground voltage having a higher voltage level than that of the standard ground; a first power circuit, which is connected with the first power supply and the standard ground and which operates in response to the first power source voltage; and a second power circuit, which is connected with the second power supply and the elevated ground circuit and which operates in response to the second power source voltage.

The second power circuit can be constructed of a bit line precharge circuit, a data line precharge circuit and a write driver circuit. The first power circuit can be constructed of a memory cell array and a sense amplifier circuit.

The first power source voltage can have the voltage level of the internal power source voltage. The second power supply can have a transistor to change the voltage level of the first power source voltage to the voltage level of the second power source voltage. The elevated ground circuit can have a transistor, to change the standard ground voltage of the standard ground to the elevated ground voltage of the elevated ground circuit.

This embodiment provides a semiconductor memory device having low power consumption and reduced chip size.

BRIEF DESCRIPTION OF THE DRAWINGS

Exemplary embodiments of the invention are described with reference to the accompanying drawings, of which.

DETAILED DESCRIPTION OF THE INVENTION

Exemplary embodiments of the present invention will be described with reference to FIGS. 3 and 5.

Figure 1:
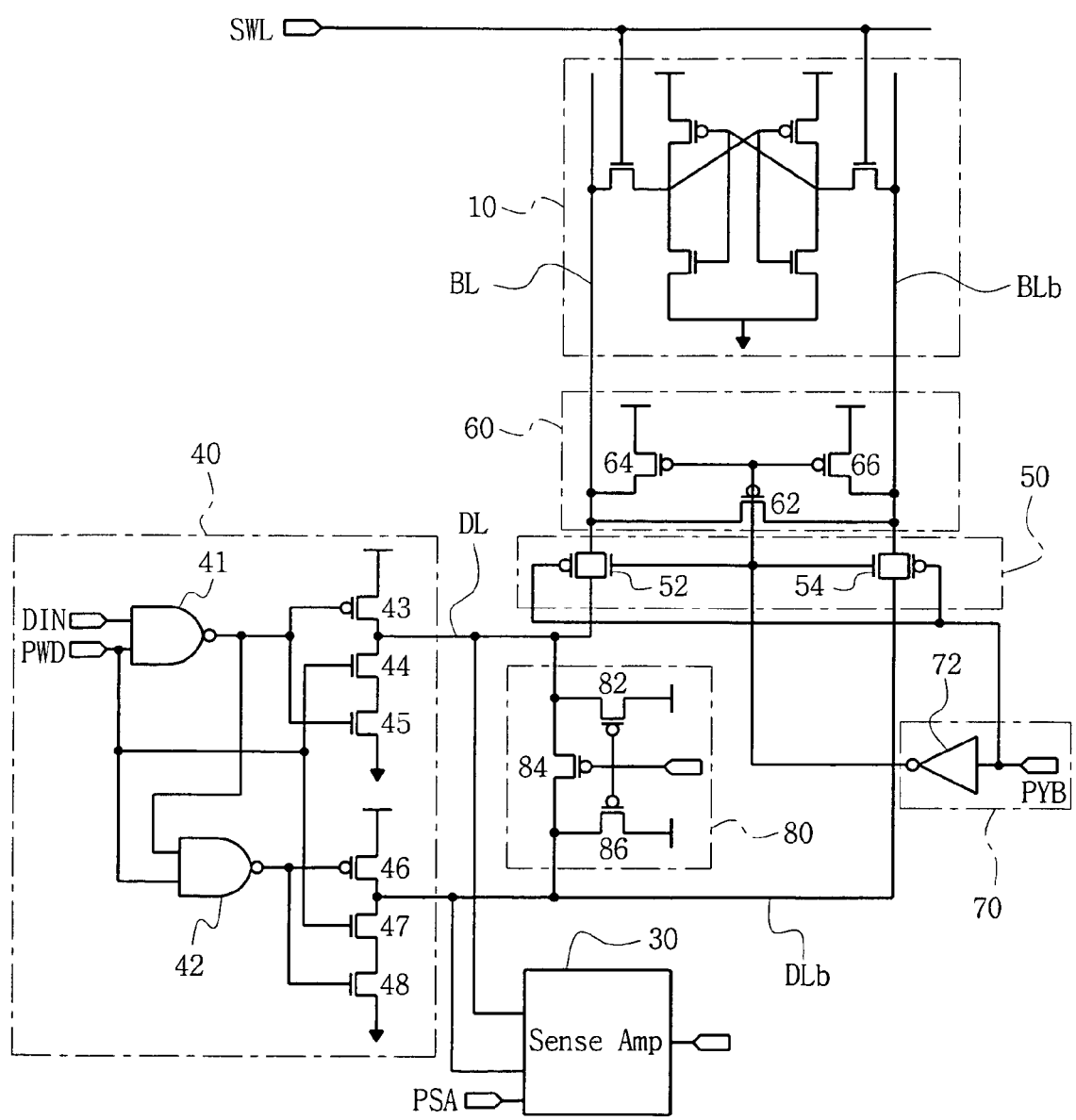
FIG. 1 is a circuit diagram of a semiconductor memory device according to the prior art.
Figure 2:
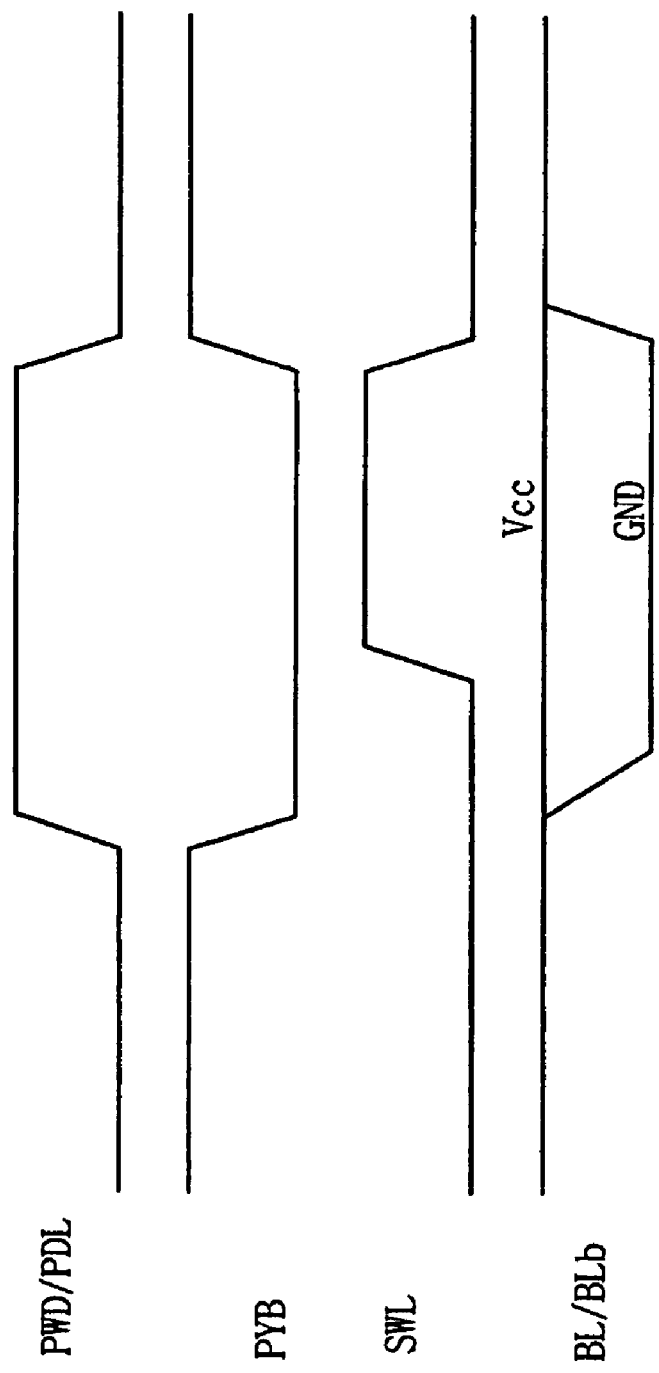
FIG. 2 is a timing diagram for the operations referred to in FIG. 1.
Figure 3:
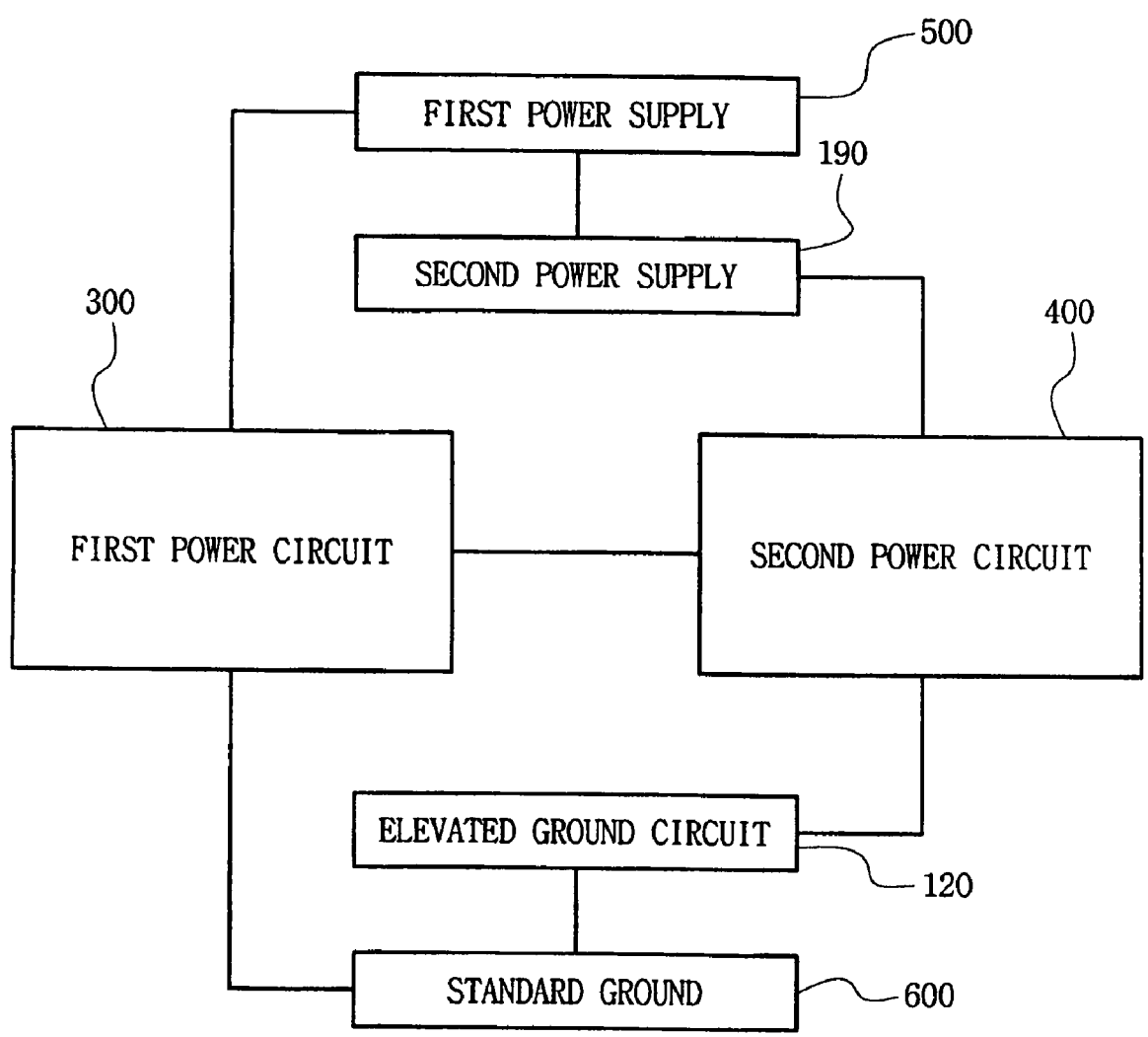
FIG. 3 is a block diagram of a semiconductor memory device according to an exemplary embodiment of the present invention.

FIG. 3 is a block diagram of a semiconductor memory device according to an exemplary embodiment of the present invention wherein, a semiconductor memory device according to an exemplary embodiment includes a first power supply 500, a second power supply 190, a first power circuit 300, a second power circuit 400, a standard ground 600 and an elevated ground circuit 120.

The first power supply 500 supplies a first power source voltage Vcc as the internal power source Vcc, which can be about 1.8V.

The second power supply 190 supplies a second power source voltage having a lower voltage level than the first power source voltage. The second power supply 190 can be constructed with a voltage divider, a diode type circuit, or a circuit well known to those skilled in the art. The level of the second power source voltage can be about 1.3V, or about 0.5V lower than the first power source voltage.

The standard ground 600 provides a standard ground voltage Vss, which is about 0V.

The elevated ground circuit 120 provides an elevated ground voltage having a higher voltage level than the standard ground 600. The elevated ground circuit 120 can be constructed with a transistor circuit, or a circuit well known to those skilled in the art. The voltage level of the elevated ground circuit 120 can be higher by about 0.5V than the standard ground voltage Vss of the standard ground 600.

The first power circuit 300 is connected with the first power supply 500 and the standard ground 600, and operates in response to the first power source voltage Vcc. The first power circuit 300 can be constructed of circuits responsive to the speed of the semiconductor memory device when the operating voltage of the memory cell array or sense amplifier circuit is lowered.

The second power circuit 400 is connected with the second power supply 190 and the elevated ground circuit 120, and operates in response to the second power source voltage. The second power circuit 400 can be constructed of circuits which are less responsive to the speed of the semiconductor memory device even if the operating voltage is lowered. For example, a bit line precharge circuit, a data line precharge circuit and a write driver circuit, etc. can operate from the second power source voltage.

Figure 4:
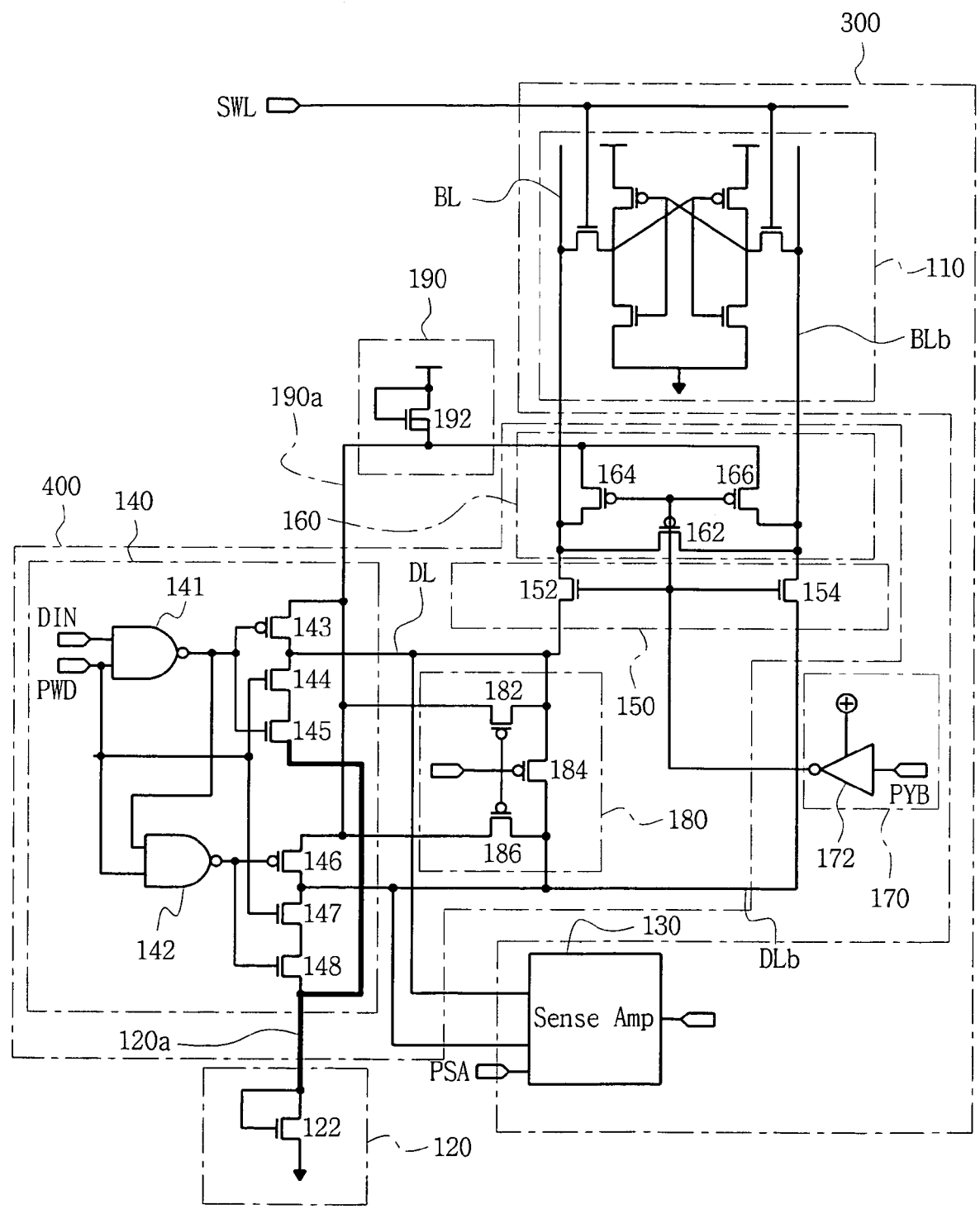
FIG. 4 is a circuit diagram illustrating an example of the semiconductor memory device shown in FIG. 3.

FIG. 4 is a circuit diagram illustrating in detail an example of FIG. 3.

As shown in FIG. 4, a semiconductor memory device according to an exemplary embodiment of the invention, as an example an SRAM (Static Random Access Memory), includes a first power supply, a second power supply 190, a first power circuit 300, a second power circuit 400, a standard ground and an elevated ground circuit 120.

The first power supply is provided as the internal power source and is designated by a standard voltage supply symbol in the circuit diagram.

The second power supply 190 is connected between the first power supply and a power line 190a of the second power source voltage, and is constructed with an NMOS transistor 192 of which the gate is connected to the first power supply. The second power source voltage is lower by a threshold voltage Vth of the NMOS transistor 192 from the first power source voltage Vcc, by the NMOS transistor 192, and is supplied by the power line 190a of the second power supply.

The standard ground has a standard ground voltage Vss, with a voltage level of about 0V, and is indicated as a down arrow mark.

The elevated ground circuit 120 is connected between an elevated ground line 120a and the standard ground, and is constructed with an NMOS transistor 122 of which the gate is connected to the elevated ground line 120a. The elevated ground voltage is higher by the threshold voltage vth of the NMOS transistor 122 from the standard ground voltage Vss, through the NMOS transistor 122, and is connected to the elevated ground line 120a.

The first power circuit 300 is constructed of circuits in which the operating voltage is responsive to the speed of the semiconductor memory device and which operate from the first power source voltage Vcc as the internal power source voltage. That is, a memory cell array connected to a memory cell 110, and a sense amplifier 130, etc. can be supplied from the first power circuit 300. Circuits of the first power circuit 300 are grounded through the standard ground.

The second power circuit 400 is constructed of circuits which are less responsive to the speed of the semiconductor memory device and which are connected to the power line 190a of the second power source voltage, to operate from the second power source voltage. The second power circuit 400 includes a bit line precharge circuit 160, a data line precharge circuit 180 and a write driver circuit 140, etc. Circuits of the second power circuit 400 can be grounded through the elevated ground circuit 120.

Additionally, in such a semiconductor memory device, the first power source voltage Vcc, the second power source voltage Vcc–Vth, the standard ground voltage Vss and the elevated ground voltage Vss+Vth are used, thus a column decoder circuit 170 for outputting a column enable signal PYB or the inversion signal of the column enable signal PYB in response to an address signal can operate from an external power source voltage Vpp having a voltage level higher than that of the first power source voltage Vcc in a read and write operation.

The memory cell array is constructed of memory cells 110 arranged in rows and columns. The memory cell 110 is connected with three signal lines, namely, a bit line BL, a complementary bit line BLb, and a word line SWL. The word line SWL, as any one of a plurality of word lines, is selected by a row selection circuit (not shown) that operates in response to a row address request.

The column selection circuit 150 responds to the column enable signal PYB or the inversion signal of the column enable signal PYB, and can be constructed of NMOS transistors 152 and 154 that are individually connected with the respective bit lines BL and BLb. Thus, the chip size can be reduced.

The bit line pair BL and BLb is precharged to a second power source voltage Vcc–Vth or the elevated ground voltage Vss+Vth, thus current can be transferred sufficiently with one NMOS transistor 152, 154. In the column selection circuit 150, by using a column address, the bit line pair BL and BLb connected to the memory cell 110 is selected by the inversion signal of the column enable signal PYB applied through a column decoder 170 that operates from the external power source voltage Vpp, and is then connected with data lines DL and DLb. The selected bit line pair BL and BLb is connected with a sense amplifier 130 and a write driver circuit 140 through a corresponding data line pair DL and DLb.

The bit line precharge circuit 160 precharges the bit line pair BL and BLb connected to the memory cell 110 by the second power source voltage level Vcc–Vth. In the bit line precharge circuit 160, three PMOS transistors 162, 164 and 166 are connected with bit line pair BL and BLb. The PMOS transistors 164 and 166 have current paths each formed between bit lines BL and BLb corresponding to the second power source voltage Vcc–Vth. The PMOS transistor 162 has a current path formed between the bit line pair BL and BLb. The PMOS transistors 162, 164 and 166 are controlled in common by a bit line precharge signal from the inversion signal of the column enable signal PYB. In other words, the PMOS transistors 162, 164 and 166 are switched simultaneously in conformity with a bit line precharge voltage level.

The write driver circuit 140 operates in response to the second power source voltage Vcc–Vth, and is constructed of NAND gates 141 and 142, PMOS transistors 143 and 146 and NMOS transistors 144, 145, 147 and 148, and drives data DIN on data lines DL and DLb in response to a data write signal PWD in a write operation.

The sense amplifier 130 senses and amplifies data of the memory cell in response to a sense amplifier enable signal PSA.

The data line precharge circuit 180 is constructed of PMOS transistors 182, 184 and 186 to precharge data lines DL and DLb to the second power source voltage Vcc–Vth. The PMOS transistors 182 and 186 have current paths each formed between data lines DL and DLb corresponding to the second power source voltage Vcc–Vth. The PMOS transistor 184 has a current path formed between the data line pair DL and DLb.

Figure 5:
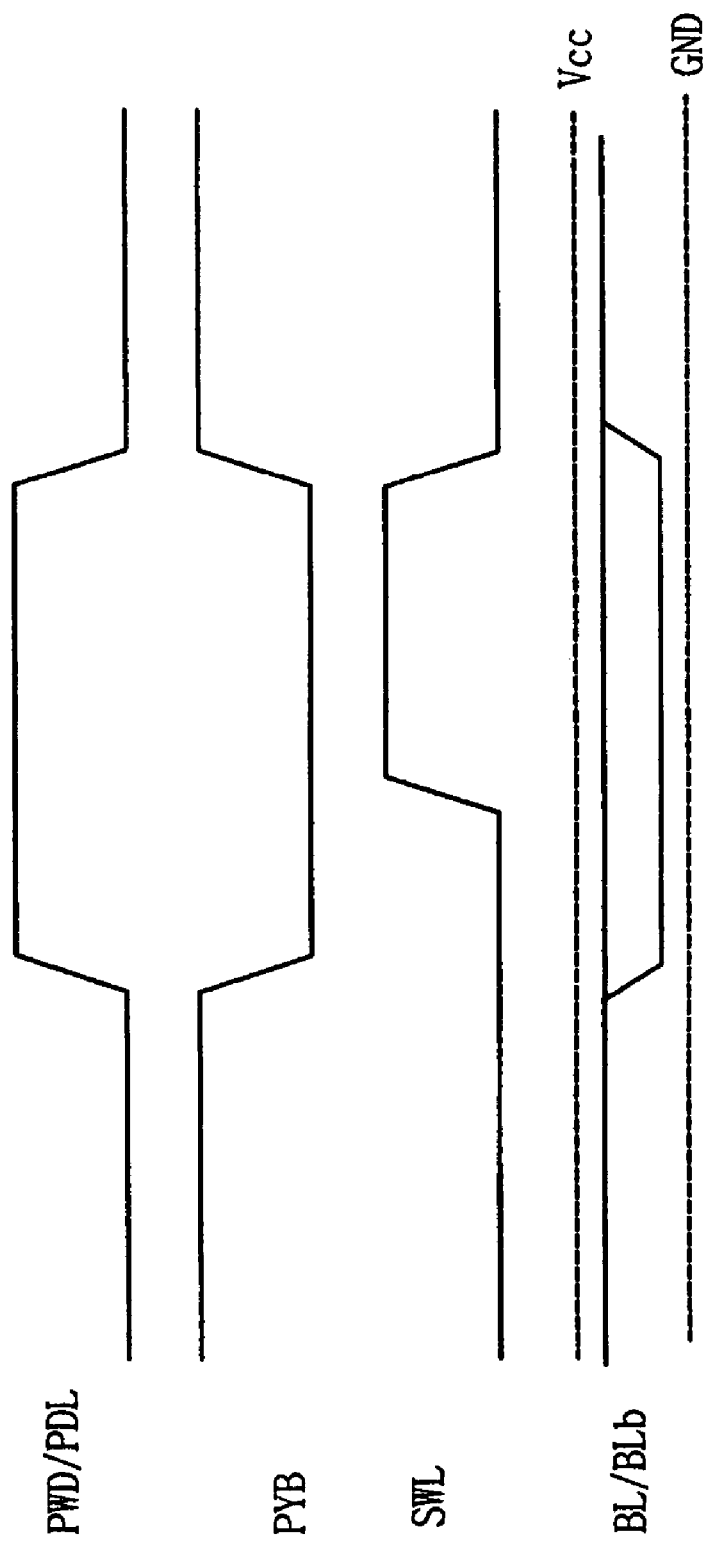
FIG. 5 is a timing diagram for the operations referred to in FIG. 4.

FIG. 5 is a timing diagram for the operations of FIG. 4.

Referring to FIGS. 4 and 5, a data write operation of a semiconductor memory device according to an exemplary embodiment will be described as follows.

Data DIN is transferred to data lines DL and DLb in response to a data write signal PWD. Then, full voltage swing data is transferred to bit lines BL and BLb through a CMOS transistor constituting a column selection circuit 50 that responds to a column enable signal PYB. When a word line SWL is enabled, one pair of data is written in a selected memory cell 110 through the selected bit lines BL and BLb.

As described above, in a semiconductor memory device according to an exemplary embodiment of the present invention, the precharge level of bit lines BL and BLb and data lines DL and DLb is lowered from the first power source voltage Vcc to the second power source voltage Vcc–Vth in write and read operations, as compared with a conventional circuit, and the low voltage level in a write operation is increased from the standard ground voltage Vss to the elevated ground voltage Vss+Vth. Accordingly, in a write operation the voltage swing level of bit lines and data lines can be reduced by over half and the power consumption can be reduced.

Though a semiconductor memory device and an operating method therefore according to an exemplary embodiment were described above with the example of an SRAM device, it is applicable to memory devices such as a DRAM etc. and other nonvolatile memories.

As described above, according to an exemplary embodiment of the invention, a data line and bit line voltage swing level can be reduced in read or write operation, therefore the write power consumption can be substantially reduced effectively and the chip size and costs can be reduced.

While the present invention has been particularly shown and described with reference to exemplary embodiments thereof, it will be understood by those skilled in the art that various changes in form and details may be made therein without departing from the spirit and scope of the present invention as defined by the appended claims. For example, an internal configuration of circuit may be changed, or internal devices of circuit may be replaced with other equivalent devices. Accordingly, these and other changes and modifications are seen to be within the true spirit and scope of the invention as defined by the appended claims.

What is claimed is:

1. A semiconductor memory device, which has an array of memory cells connected with a plurality of bit line pairs and a plurality of word lines, to perform a read or write operation of data, the semiconductor memory device comprising:

a first power supply for supplying a first power source voltage;

a second power supply for supplying a second power source voltage having a lower voltage level than the first power source voltage;

a standard ground for providing a standard ground voltage;

an elevated ground circuit for providing an elevated ground voltage having a higher voltage level than the standard ground voltage;

a first power circuit, which is connected with the first power supply and the standard ground and which operates in response to the first power source voltage; and a second power circuit, which is connected with the second power supply and the elevated ground circuit and which operates in response to the second power source voltage.

2. The semiconductor memory device of claim 1, wherein the second power circuit comprises a bit line precharge circuit, a data line precharge circuit and a write driver circuit.

3. The semiconductor memory device of claim 2, wherein the first power circuit comprises a memory cell array and a sense amplifier circuit.

4. The semiconductor memory device of claim 3, wherein the first power source voltage has the voltage level of an internal power source voltage.

5. The semiconductor memory device of claim 4, wherein the second power supply has a transistor to change the voltage level of the first power source voltage to the voltage level of the second power source voltage.

6. The semiconductor memory device of claim 5, wherein the elevated ground circuit has a transistor to change the standard ground voltage of the standard ground to the elevated ground voltage of the elevated ground circuit.

7. The semiconductor memory device of claim 6, wherein a column selection circuit connected to the memory cells to select a bit line pair has transistors individually connected to the bit line pairs.

8. The semiconductor memory device of claim 7, wherein a column decoder circuit for generating a column enable signal to drive the column selection circuit operates from an external power source voltage having a voltage level higher than the internal power source voltage.

9. A method of operating a semiconductor memory, which has an array of memory cells connected with a plurality of bit line pairs and a plurality of data line pairs, to perform a read or write operation of data, the method comprising:

supplying a first power source voltage;
supplying a second power source voltage having a lower voltage level than the first power source voltage;
providing a standard ground voltage;
providing an elevated ground voltage having a higher voltage level than the standard ground voltage;
precharging bit lines from the second power source voltage;
precharging data lines from the second power source voltage; and
driving data lines from the second power source voltage or the elevated ground.

10. The method of operating a semiconductor memory of claim 9, wherein the first power source voltage has the voltage level of an internal power source voltage.

11. The method of operating a semiconductor memory of claim 9, wherein a column decoder circuit for generating a column enable signal operates from an external power source voltage having a voltage level higher than the internal power source voltage.

12. A semiconductor device having a memory module, wherein the semiconductor device has a first power supply for supplying a first power source voltage and a standard ground for providing a standard ground voltage, wherein the memory module comprises:

an array of memory cells connected with a plurality of bit line pairs and a plurality of data line pairs;

a second power supply for supplying a second power source voltage having a lower voltage level than the first power source voltage; and an elevated ground circuit for providing an elevated ground voltage return path having a higher voltage level than the standard ground voltage;

13. The semiconductor device of claim 12 wherein the memory module further comprises:

a write driver circuit providing the second power source voltage and the elevated ground voltage to the data lines.

14. The semiconductor device of claim 12 wherein the memory module further comprises:

a bit line precharge circuit providing the second power source voltage to the bit lines.

15. The semiconductor device of claim 12 wherein the memory module further comprises:

a data line precharge circuit providing the second power source voltage to the data lines.

16. The semiconductor device of claim 12, wherein the memory cell array operates from the second power source voltage or the elevated ground voltage.

* * * * *